US006531413B2

(12) United States Patent
Hsieh et al.

(10) Patent No.: US 6,531,413 B2
(45) Date of Patent: Mar. 11, 2003

(54) METHOD FOR DEPOSITING AN UNDOPED SILICATE GLASS LAYER

(75) Inventors: Chris Hsieh, Taipei (TW); Kevin Luo, Hsinchu Hsien (TW)

(73) Assignee: United Microelectronics Corp., Hsinchu (TW)

( * ) Notice: Subject to any disclaimer, the term of this patent is extended or adjusted under 35 U.S.C. 154(b) by 135 days.

(21) Appl. No.: 09/730,127

(22) Filed: Dec. 5, 2000

(65) Prior Publication Data

US 2002/0068416 A1 Jun. 6, 2002

(51) Int. Cl.[7] ................. H01L 21/31; H01L 21/469
(52) U.S. Cl. ................. 438/782; 438/435; 438/787
(58) Field of Search ........................ 438/763, 680, 438/784, 674, 221, 296, 359, 700, 391, 424, 435, 437, 624, 761, 778, 782, 787

(56) References Cited

U.S. PATENT DOCUMENTS

| 4,082,865 A | * | 4/1978 | Ban et al. ................. 427/253 |
| 5,593,741 A | * | 1/1997 | Ikeda ........................ 427/579 |
| 5,770,469 A | * | 6/1998 | Uram et al. ................ 438/246 |
| 2001/0046777 A1 | * | 11/2001 | Kim et al. .................. 438/702 |

OTHER PUBLICATIONS

Book: Silicon Processing For The VLSI Era vol. 1 p. 168 & vol. 3 p. 362: Process integration. Stanley Wolf Ph.D. vol. 1 is Published by Lattice Press in 1986, and vol. 3 is Published by Lattice Press in 1995.*

* cited by examiner

*Primary Examiner*—Amir Zarabian
*Assistant Examiner*—Jamie L. Brophy

(57) ABSTRACT

A method for depositing an undoped silicate glass layer. An undoped silicon glass layer is formed to fill a recessed region in a semiconductor substrate by performing at least three chemical vapor depositions. The recessed region is a trench of a shallow trench isolation, or a gap between a plurality of polysilicon or conductive layers. At each pass, under deposition conditions that are as conventionally defined, this method comprises increasing the number of times of deposition performed on the substrate and decreasing the time of each deposition inside a reaction chamber in order to have the thickness of the undoped silicate glass thinner. In this manner, the gap filling ability is enhanced and void formation is prevented. This method also includes, before each deposition is performed, rotating the semiconductor substrate a given angle in a clockwise or counter-clockwise direction so that by the last deposition, the semiconductor substrate has rotated a total of 360° or a multiple of 360°. This method allows having the undoped silicate glass deposit uniformly upon the substrate.

14 Claims, 4 Drawing Sheets

METHOD FOR DEPOSITING AN UNDOPED SILICATE GLASS LAYER

BACKGROUND OF THE INVENTION

1. Field of the Invention

The present invention relates to a method for fabricating semiconductor devices. More particularly, the present invention relates to a method for depositing undoped silicate glass on a substrate.

2. Description of the Related Art

A principal component of undoped silicate glass is silicon dioxide ($SiO_2$) which is commonly used as dielectric material in semiconductor processing. Silicon dioxide ($SiO_2$) and silicon nitride ($Si_3N_4$) are the two prevalent dielectric material used in semiconductor processing. However, since the dielectric constant of silicon dioxide, which is about 3.9, is lower than that of silicon nitride, which is about 7.5, silicon dioxide is usually preferred for use as a insulation material between active regions or conductive lines.

Two prevalent reactive gases used for forming silicon dioxide by chemical vapor deposition (CVD) are silicon hydride ($SiH_4$) and tetra-ethyl-ortho-silicate, (TEOS). Since the step coverage ability of TEOS is better, TEOS is preferred in semiconductor manufacture. Usually, TEOS and ozone ($O_3$) are used together as reactive gases in an atmospheric-pressure chemical vapor deposition (APCVD) for depositing the undoped silicate glass to form shallow trench isolation (STI), inter-poly dielectrics (IPD) or interlayer dielectrics (ILD). Thus, gap-filling ability of the undoped silicate glass is very important.

The gap-filling ability of a APCVD process using $O_3$ and TEOS as etching gases is mainly determined by a specific process parameter: the $O_3$/TEOS flow rate ratio. The smaller the $O_3$/TEOS ratio, the higher the likelihood of a conformal undoped silicate glass film being formed, which does not benefit the gap-filling ability. The greater this ratio, the higher the likelihood of a flow-like undoped silicate glass film being formed, which is beneficial to the gap-filling ability. In an APCVD process for depositing undoped silicate glass film, the conventional range of values of $O_3$/TEOS ratio is set between 14 and 17.

FIG. 1a shows conventional continuous-type APCVD deposition machine. Inside an APCVD processing station 100, a wafer or semiconductor substrate 102 is transported linearly into an APCVD chamber 108 for a deposition process. At the top of an APCVD chamber 108, injectors 107 spurt reactive gases downward. When the wafer 102 is right below the injector 107, the reaction product is deposited to cover the wafer 102 surface, which completes the chemical vapor deposition.

Using TEOS and ozone ($O_3$) as reactive gases, the undoped silicate glass is deposited to form STI, IPD, ILD, etc. The wafer 102 is transported into the deposition station twice (known as 2-pass) to deposit undoped silicate glass thereon. When the wafer 102 is transported into the APCVD station to perform the second deposition, the wafer 102 is rotated 90 degrees.

FIG. 1b shows a conventional 2-pass APCVD method for depositing undoped silicate glass layers 110 into recessed region 103. The recessed region 103 can be a trench for a STI or a gap between a polysilicon layer and a conductive layer. When the fabrication technology is at 0.18 micrometers or even below 0.15 micrometers, the gap spacing is further narrowed. When using conventional method to deposit the undoped silicate glass 110, because the gap-filling ability is not good, key-hole voids 105 are usually formed in the recessed region 103.

As shown in FIG. 1a and FIG. 1c, the 2-pass APCVD process for depositing undoped silicate glass film 110 on a wafer or a semiconductor substrate 102 is now described in detail. The wafer 102 is linearly transported at a constant speed in the reaction chamber 108. The reactive gases 106 are spurted downward from the injector 107. Consequently, the reactive gases 108 are not uniformly distributed on the wafer 102. During the second deposition, although the wafer 102 is rotated 90° with a reference notch 112 in the perimeter of the wafer 102, reactive gases 108 are still not distributed uniformly on the wafer 102. That leads to several problems as enumerated hereafter.

Since the substrate 102 remains inside the reaction chamber 108 too long, the deposited product is too thick. Therefore, the gap filling ability is affected, which leads to voids formation. As a result, the electrical insulating of devices is altered. In addition, in a subsequent etching-back process, the reactive gases contained in the voids are then released, which causes contamination of others semiconductor elements. Moreover, since the thickness of deposited undoped silicate layer is not uniform, the subsequent planarization process cannot be effectively performed.

Regarding this insufficient gap filling ability issue, several solutions have been proposed. These include increasing the temperature of the station, increasing the $O_3$/TEOS ratio, and changing the deposition pressure. All these options have the same purpose of enhancing fluidity of the undoped silicate and increasing the gap filling ability. Although these solutions may reduce void occurrence in the isolation layer, the improvement of the deposition distribution is still limited. Moreover, those solutions cause many drawbacks, which are temperature increase, electrical isolation deficiency, throughput decrease, etc.

SUMMARY OF THE INVENTION

The invention provides a method for forming undoped silicate glass in substrate recessed regions that enhances uniformity of deposited layer thickness. The present invention provides a method for forming an undoped silicate glass layer wherein the CVD process is successively performed at least three times to deposit an undoped silicate glass layer in recessed regions of a semiconductor substrate. The recessed regions filled with undoped silicate glass form structures, comprising STI, or dielectric layers between a plurality of polysilicon layers or conductive layers. Keeping the deposition conditions including temperature, pressure, gas source, and a total thickness of the undoped silicate glass layer fixed, this method comprises increasing the number of passes of deposition performed on the substrate and decreasing the time of deposition inside a reaction chamber in order to reduce the thickness of the deposited undoped silicate glass. The gap filling ability then is enhanced and voids formation is prevented. The method also includes, before each deposition is performed, a clockwise or counterclockwise rotation of the semiconductor substrate by a given angle so as that the semiconductor substrate rotates a total of 360° or a multiple of 360° by the last deposition. Therefore, the method allows a uniform deposition of undoped silicate glass upon the substrate.

According to a preferred embodiment of the present invention, under given conditions of deposition including temperature, pressure, gases source and for a total fixed thickness, the deposition on a substrate can be performed by 4 passes through a reaction chamber. At each pass, before the deposition is performed, the substrate is clockwise or counter-clockwise rotated 90°. Thus, after performing the fourth pass, the substrate has rotated an angle of 360°.

As embodied and broadly described herein, the invention provides the following features. Under given deposition conditions of temperature, pressure, gases source, and for a total fixed thickness, the number of passes for depositing is increased and the time of deposition inside the reaction chamber is shortened, which reduces the thickness of deposited layer at each pass. As a result, the gap filling ability is enhanced and no voids are formed. Moreover, since the substrate is rotated a given angle, the deposition thus can be uniformly distributed on the surface of the semiconductor substrate. Besides, as performing the present method does not influence manufacture throughput, the present invention can be put into practice in the related industry.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

The present invention provides a method for uniformly depositing undoped silicate glass layers in recessed regions, also called trenches or gaps, wherein two preferred embodiments are described as follows.

Figure 1A:
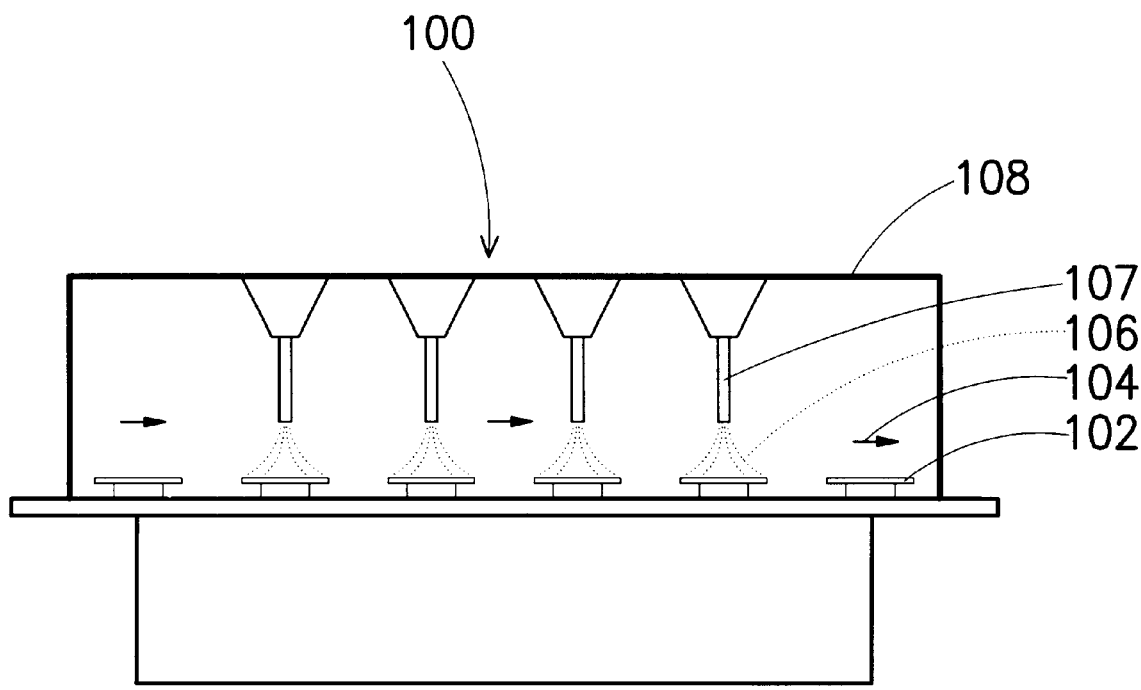
FIG. 1a shows a conventional APCVD station.
Figure 1B:
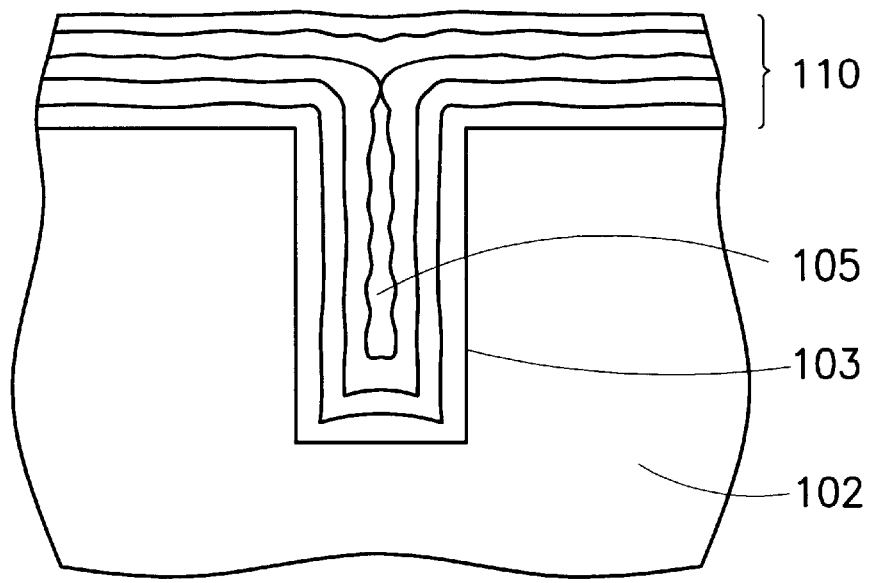
FIG. 1b shows a cross-sectional view of a recessed region in a substrate that is filled with an undoped silicate glass layer by a 2-pass APCVD according to in the prior art.
Figure 1C:
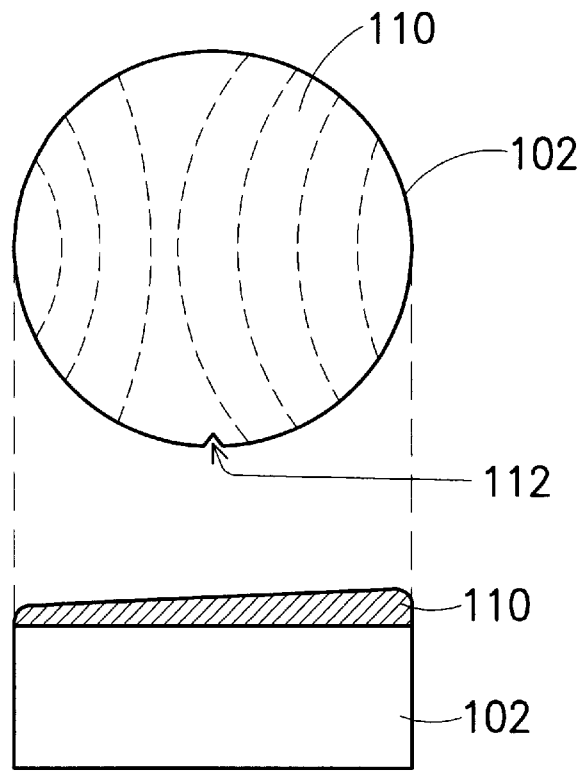
FIG. 1c shows a wafer that is covered by a 2-pass APCVD deposition process according to the prior art.
Figure 2A:
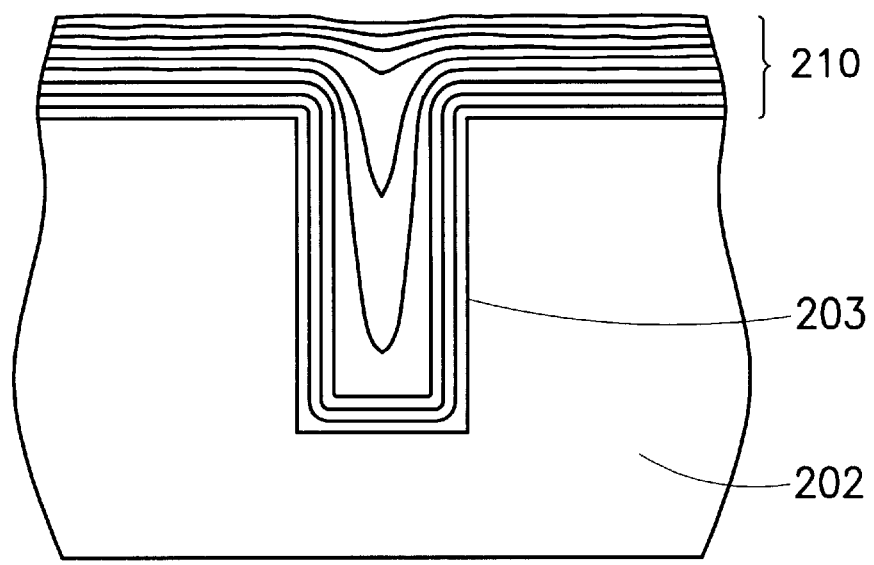
FIG. 2a shows a cross-sectional view of a trench filled with undoped silicate glass by a deposition process according to a first preferred embodiment of the present invention.
Figure 2B:
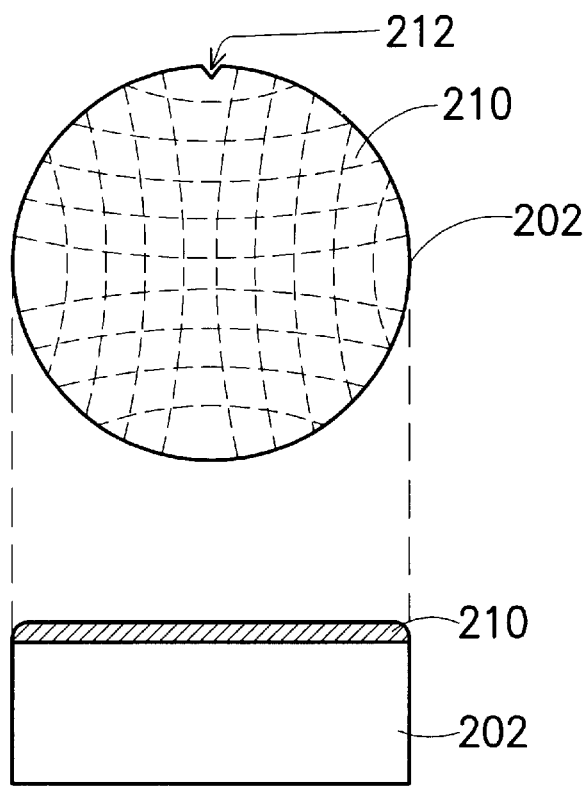
FIG. 2b shows a cross-sectional view and a top view of depositing an undoped silicate layer on a wafer according to a first preferred embodiment of the present invention.

FIG. 2a and FIG. 2b illustrate a first embodiment of the present invention that is now detailed.

In FIG. 2a, a trench 203 has been previously formed in a substrate 202 by a conventional process. All the processes performed prior to a deposition of an undoped silicate glass layer 210 have been completed. Deposition conditions, including temperature, pressure, gas source, and total deposition thickness of the undoped silicate glass layer 210, are kept the same as those of the conventional method. In order to form an undoped silicate glass layer 210, a semiconductor substrate 202 is transported into an APCVD station repeatedly at least three times, for example 4 times (4-pass). The undoped silicate glass layer 210 is formed by successively depositing the undoped silicate glass into the trench 203. At each pass before the semiconductor substrate 202 is transported into the station for deposition, the substrate 202 is clockwise or counter-clockwise rotated by a fixed angle, for instance, 90°. In this way, by the last deposition pass, the substrate 202 has rotated a total of 360° or a multiple of 360°.

FIG. 2a shows the result of a 4-pass APCVD deposition in a trench. The time for the substrate 202 remaining inside the reaction chamber is shorter than that for a conventional 2-pass APCVD. As a result, the layer deposited at each pass is thinner, which enhances the gap filling ability. Consequently, formation of voids inside the filled aperture 203 is prevented.

With reference to FIG. 2b, according to the first embodiment of this method, an undoped silicate glass layer 210 is deposited on a surface of a wafer 202. At each pass, before the wafer 202 is transported into the station for deposition, the wafer 202 is clockwise or counter-clockwise rotated a fixed angle, for instance, 90°. A notch 212 in the perimeter of the wafer 202 serves as rotation reference mark. In this way, by the fourth pass, the wafer 202 has rotated 360°. Consequently, the deposited undoped silicate glass layer 210 has a uniform distribution on the surface of the wafer 202, which benefits a subsequent planarization process.

Regarding the throughput, in the 2-pass APCVD deposition process of in the prior art, the throughput rate is 15.7 pieces per hour. In the 4-pass APCVD of the present invention, the throughput rate is 15.5 pieces per hour. Thus, the throughput is not significantly affected.

Figure 3A:
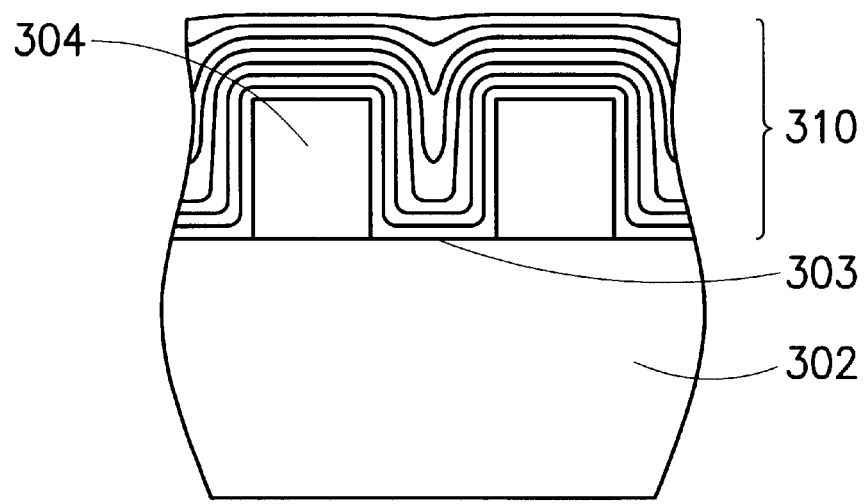
FIG. 3a shows a cross-sectional view of depositing an undoped silicate glass layer in gaps of a semiconductor substrate according to a second embodiment of the present invention.
Figure 3B:
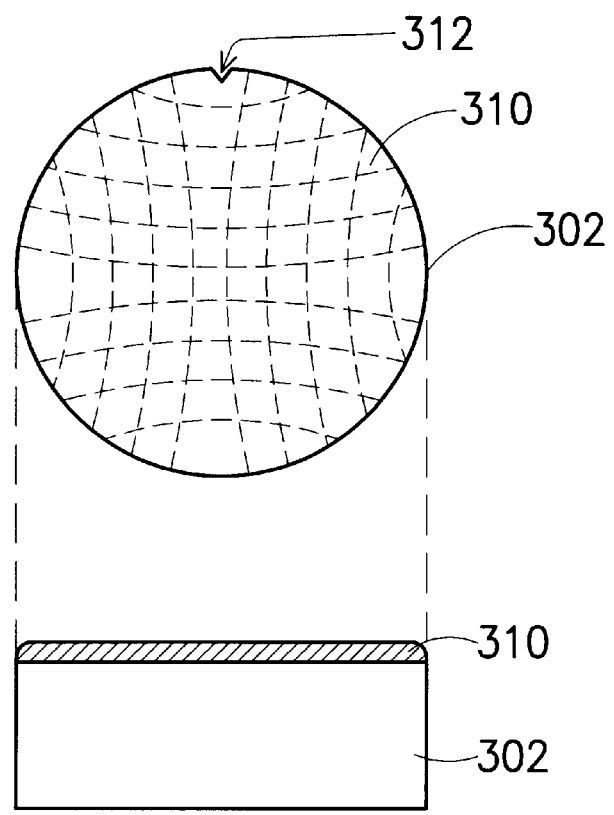
FIG. 3b shows a cross-sectional view and a top view of depositing an undoped silicate layer on a wafer according to a second preferred embodiment of the present invention.

FIG. 3a and FIG. 3b illustrate a second preferred embodiment of the present method for depositing undoped silicate glass layer on a wafer or semiconductor substrate.

FIG. 3a shows the result of a deposition in gap 303 of a semiconductor substrate according to the present method. A plurality of elements (not shown) and a plurality of polysilicon or conductive layers 304 (for instance conductive lines) separated by gaps 303 are formed on a semiconductor substrate 302, according to a conventional process. Deposition conditions, including temperature, pressure, gas source, and the total deposition thickness of the undoped silicate glass layer 310, are kept the same as those of the conventional method. A semiconductor substrate 302 is transported into the reaction chamber for a deposition process. The semiconductor substrate 302 passes through the APCVD station at least 3 times, for example, 4 times (4-pass). The undoped silicate glass layer 310 is formed by successively depositing the undoped silicate glass into the gap 303 to form a dielectric layer between polysilicon layers or between conductive layers. At each pass before it is transported into the station for deposition, the semiconductor substrate 302 is clockwise or counter-clockwise rotated a fixed angle, for instance 90°. In this way, by the last deposition pass, the semiconductor substrate 302 has rotated a total of 360° or a multiple of 360°.

As shown in FIG. 3a, with a 4-passes APCVD deposition process, for which the time of deposition of each pass is shorter than that of a 2-pass process, the layer deposited at each pass is thinner. As a result, the gap filling ability is enhanced and voids formation inside gaps 303 is prevented.

Referring to FIG. 3b, according to the aforementioned embodiment of this method, an undoped silicate glass layer 310 is deposited on a surface of a wafer 302. At each pass, before entering the station for deposition, the wafer 302 is clockwise or counter-clockwise rotated a fixed angle, for instance 90°. A notch 312 in the perimeter of the wafer 302 serves as rotation reference mark. In this way, by the fourth pass, the wafer 302 has rotated 360°. Consequently, the deposited undoped silicate glass layer 310 has a uniform distribution on the surface of the wafer 302, which benefits a subsequent planarization process.

Regarding the throughput, in a conventional 2-pass APCVD deposition process deposition has a rate of 15.7 pieces per hour. In the 4-pass APCVD of the present invention, the throughput rate is 15.5 pieces per hour. Thus the throughput is not significantly affected.

In conclusion, the first and second embodiment of the present invention provide a method for depositing undoped silicate glass layer in order to form shallow trench isolation or a dielectric layer between polysilicon or conductive layers. Then, the deposition temperature, the pressure, the gas source, and the total deposition thickness of the undoped silicate glass layer 210 are kept the same. The method comprises the steps of increasing the number of deposition passes and shortening the deposition time inside the reaction chamber for reducing the thickness of the deposition at each pass. This results in increasing the gap filling ability and preventing void formation. Besides, since the wafer is turned a fixed angle at each pass such that by the last pass it has rotated a total of 360° or a multiple of 360°, the distribution of the deposited undoped silicate glass layer on the wafer is uniform, which benefits a further planarization process. The two preferred embodiments of this method for depositing undoped silicate glass, after being carried out, do not substantially influence the throughput, and substantially enhance the gap filling ability and the deposition uniformity. Thus it can be put into practice in the related industry.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for depositing an undoped silicate glass layer, comprising:

providing a substrate having a recessed region therein;

successively depositing undoped silicate glass in the recessed region by chemical vapor deposition (CVD) so as to form an undoped silicate glass layer, wherein the undoped silicate glass layer is deposited through at least three passes of chemical vapor deposition, the deposition conditions being defined identical at each pass; and at each pass before a deposition is performed; rotating the substrate a fixed angle such that by a last pass, the substrate has rotated 360° or a multiple of 360°.

2. The method for depositing an undoped silicate glass layer as claimed in claim 1, wherein the recessed region is a shallow trench isolation.

3. The method for depositing an undoped silicate glass layer as claimed in claim 1, wherein the recessed region is a gap between a plurality of conductive layers.

4. The method for depositing an undoped silicate glass layer as claimed in claim 1, wherein the undoped silicate glass layer is deposited through 4 passes.

5. The method for depositing an undoped silicate glass layer as claimed in claim 1, wherein the substrate is clockwise rotated or counter-clockwise rotated a fixed angle.

6. The method for depositing an undoped silicate glass layer as claimed in claim 5, wherein the fixed angle is 90°.

7. The method for depositing an undoped silicate glass layer as claimed in claim 1, wherein the CVD is an atmospheric-pressure chemical vapor deposition.

8. The method for depositing an undoped silicate glass layer as claimed in claim 1, wherein the deposition conditions at each pass comprise temperature, pressure, gas source and the thickness of the undoped silicate layer.

9. A method for forming a dielectric layer, comprising:

providing a substrate having a recessed region therein;

successively depositing a dielectric material in the recessed region by chemical vapor deposition (CVD) so as to form a dielectric layer, wherein the dielectric layer is deposited through at least three passes of chemical vapor deposition, the deposition conditions being defined identical at each pass; and at each pass before a deposition is performed, rotating the substrate a fixed angle such that by a last pass, the substrate has rotated 360° or a multiple of 360°.

10. The method for forming a dielectric layer as claimed in claim 9, wherein the dielectric layer is deposited through 4 passes.

11. The method for forming a dielectric layer as claimed in claim 9, wherein the substrate is clockwise or counter-clockwise rotated a fixed angle.

12. The method for forming a dielectric layer as claimed in claim 9, wherein the fixed angle is 90°.

13. The method for forming a dielectric layer as claimed in claim 9, wherein the CVD deposition is an atmospheric-pressure CVD.

14. The method for forming a dielectric layer as claimed in claim 9, wherein the deposition conditions at each pass comprise temperature, pressure, gas source and the thickness of the dielectric layer.

* * * * *